(12) United States Patent
Kang et al.

(10) Patent No.: US 6,977,439 B2
(45) Date of Patent: Dec. 20, 2005

(54) SEMICONDUCTOR CHIP STACK STRUCTURE

(75) Inventors: In-Ku Kang, Chungcheongnam-do (KR); Sang-Ho Ahn, Kyungki-do (KR); Sun-Mo Yang, Chungcheongnam-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/326,775

(22) Filed: Dec. 20, 2002

(65) Prior Publication Data

US 2003/0178710 A1    Sep. 25, 2003

(30) Foreign Application Priority Data

Mar. 21, 2002  (KR) ................ 2002-15329

(51) Int. Cl.[7] .......... H01L 23/48; H01L 23/02
(52) U.S. Cl. ........ 257/777; 257/686; 257/692; 257/778
(58) Field of Search ............... 257/666, 673, 257/685, 686, 690, 692, 777, 778, 780, 782, 257/783, 784; 438/108, 118, 123, 617

(56) References Cited

U.S. PATENT DOCUMENTS

| | | | |
|---|---|---|---|
| 5,804,004 A | 9/1998 | Tuckerman et al. | 156/60 |
| 6,472,758 B1 * | 10/2002 | Glenn et al. | 257/777 |
| 6,531,784 B1 * | 3/2003 | Shim et al. | 257/777 |
| 2002/0109216 A1 * | 8/2002 | Matsuzaki et al. | 257/686 |
| 2002/0125556 A1 * | 9/2002 | Oh et al. | 257/685 |

FOREIGN PATENT DOCUMENTS

| | | |
|---|---|---|
| JP | 06-021328 | 1/1994 |
| JP | 08-288455 | 11/1996 |
| JP | 10-116849 | 5/1998 |
| JP | 2000-307057 | 11/2000 |

OTHER PUBLICATIONS

English language abstract for Japanese Publication No. 06-021328.
English language abstract for Japanese Publication No. 08-288455.
English language abstract for Japanese Publication No. 2000-307057.
English language abstract for Japanese Publication No. 10-116849.

* cited by examiner

*Primary Examiner*—Hung Vu
(74) *Attorney, Agent, or Firm*—Marger Johnson & McCollom, P.C.

(57) ABSTRACT

Semiconductor chip stack structure and method are provided. A first chip has a first metal bump formed on a first electrode pad. The first chip is attached to and electrically connected to a substrate. The electrical connection is made by a bump reverse bonding method in which one end of a bonding wire is ball-bonded to the substrate and the other end is stitch-bonded to the metal bump. The second chip is stacked on the first chip. The bonding wire is substantially parallel with a top surface of the first chip. Accordingly, the chip stack structure and method minimize a space between the first chip and the second chip, thereby reducing the total height of semiconductor chip stack.

14 Claims, 5 Drawing Sheets

SEMICONDUCTOR CHIP STACK STRUCTURE

RELATED APPLICATION

This application claims priority from Korean Patent Application No. 2002-15329, filed on Mar. 21, 2002, the contents of which are incorporated herein by reference in their entirety.

BACKGROUND OF THE INVENTION

1. Field of the Invention

The present invention relates to a semiconductor packaging technology and, more particularly, to a semiconductor chip stack structure and method for forming the same.

2. Description of the Related Art

To provide improved performance, manufacturers of integrated circuit (IC) chips continually strive to increase packaging density, which has led to the development of, for example, a three-dimensional chip stack technology. In this technology, typically, after the wafer is separated into individual chips, the chips are stacked before or after they are packaged.

The three-dimensional stack of the packaged chips, however, increases the stack height due to individual package thickness. In contrast, the three-dimensional stack of the non-packaged ("bare") chips is relatively thinner, lighter and smaller.

Among the various chip stack structures of the non-packaged chips, a stack structure having a pyramid configuration (a relatively smaller upper chip stacked on a lower chip) is known to reduce the stack height. On the other hand, if the upper chip is equal to or larger than the lower chip, a spacer is required between the upper and lower chips for preventing electrical interference that may occur when a bonding wire on the lower chip touches a bottom surface of the upper chip. Such a spacer, unfortunately, causes a substantial increase in the stack height.

FIG. 1 shows a conventional chip stack structure 10. In the chip stack, a semiconductor chip 19 ("a second chip") is stacked on a lower semiconductor chip 14 ("a first chip"), using a liquid adhesive 17 containing insulating balls 18 as the spacer. The liquid adhesive 17 is applied on the first chip 14 mounted on a substrate 11. The first chip 14 is electrically connected with a wiring pattern 13 of the substrate 11 by a bonding wire 16. When the second chip 19 is stacked on the first chip 14, the bonding wire 16 may touch the second chip 19. Thus, electrical interference between them may occur. The liquid adhesive 17 is therefore required so that the second chip 19 may not directly contact with the bonding wire 16. The liquid adhesive 17 may contain the insulating balls 18, each having a larger diameter than the highest point of the bonding wire 16 from the top surface of the first chip 14. Reference character S1 in FIG. 1 specifies a space between the first chip 14 and the second chip 19.

The wire bonding between the first chip 14 and the substrate 11 may be carried out by a conventional wire bonding process, such as a ball bonding process on the first chip 14 and subsequently a stitch bonding process on the wiring pattern of the substrate 11.

FIG. 2 shows another conventional chip stack structure 20 in which an insulating adhesive tape 27 serves as a spacer between the first chip 24 and the second chip 29. The insulating adhesive tape 27 should be thicker than the highest point of the bonding wire 26 from the top surface of the first chip 24. Reference character S2 in FIG. 2 specifies a space between the first chip 24 and the second chip 29.

As described above, the conventional chip stack technology has a disadvantage of increasing the total stack height due to the spacer required between the semiconductor chips.

SUMMARY OF THE INVENTION

The present invention is directed to forming a semiconductor chip stack structure, with which the total height of semiconductor chip stack can be reduced regardless of the size of a second chip.

A semiconductor chip stack structure comprises a substrate including a die-mounting surface and wiring patterns adjacent the die-mounting surface. A first semiconductor chip is attached to the die-mounting surface and includes first electrode pads on a top surface thereof. First conductive bumps are formed on the first electrode pads. First bonding wires electrically interconnect the substrate and the first conductive bumps. The first bonding wires have an expanse substantially parallel with the top surface of the first chip. A second semiconductor chip is stacked over the first chip using the expanse. The second semiconductor chip includes second electrode pads on a top surface thereof and is electrically connected to the wiring patterns.

A semiconductor chip stack method in accordance with an embodiment of the present invention comprises: (a) providing a substrate including a die-mounting surface and wiring patterns; (b) attaching a first chip to the die-mounting surface of the substrate; (c) forming first conductive bumps on first electrode pads of the first chip; (d) electrically interconnecting the substrate and the first chip through first bonding wires, wherein expanses of the first bonding wires are substantially parallel with the top surface of the first chip; (e) stacking a second chip over the first chip using the expanses; and (f) electrically interconnecting second electrode pads of the second chip and the wiring patterns of the substrate.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements, and, in which:

FIG. 4 shows a first semiconductor chip attached to a substrate according to an aspect of the present invention;

FIG. 5 shows a first metal bump formed on a first electrode pad of the first chip according to another aspect of the present invention;

FIG. 6 shows the first chip and the substrate electrically connected by a reverse wire bonding according to still another aspect of the present invention;

FIG. 7 shows an insulating adhesive applied on the first chip according to an aspect of the present invention;

FIG. 8 shows a second semiconductor chip on the first chip by the insulating adhesive according to another aspect of the present invention; and FIG. 9 shows the second chip and the substrate electrically connected by a reverse wire bonding according to still another aspect of the present invention.

DETAILED DESCRIPTION OF THE PREFERRED EMBODIMENT

Figure 1:
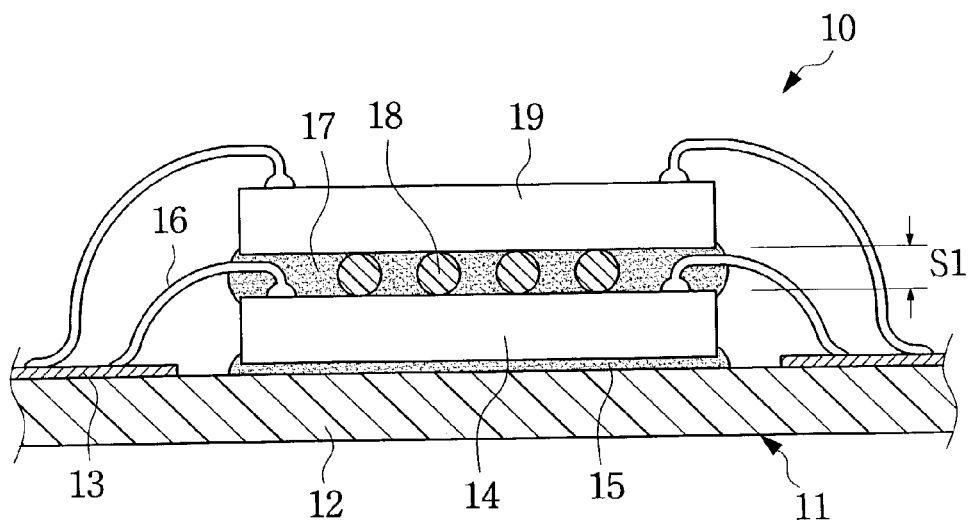
FIGS. 1 and 2 are cross-sectional views of conventional semiconductor chip stack structures.
Figure 2:
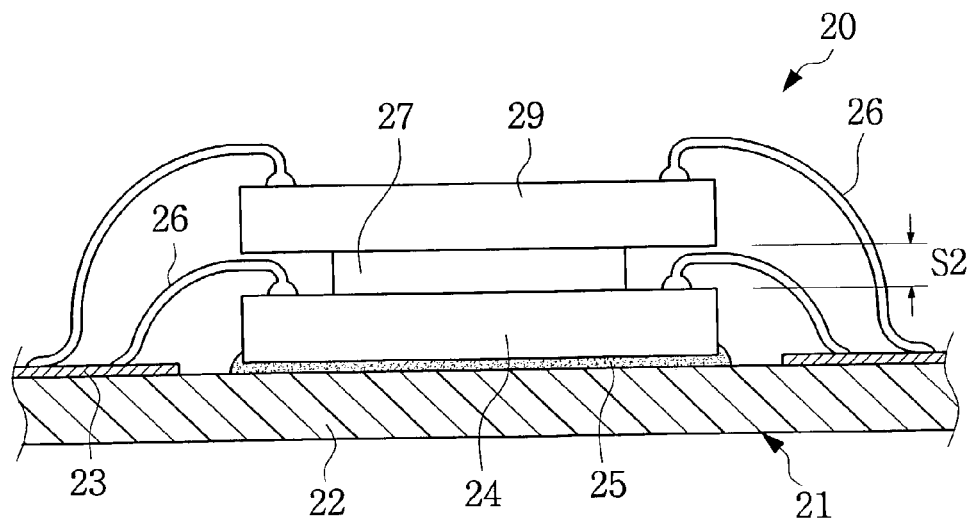

Preferred embodiments of the present invention will be described below with reference to the accompanying drawings. Like reference numerals refer to like elements throughout the drawings.

Figure 3:
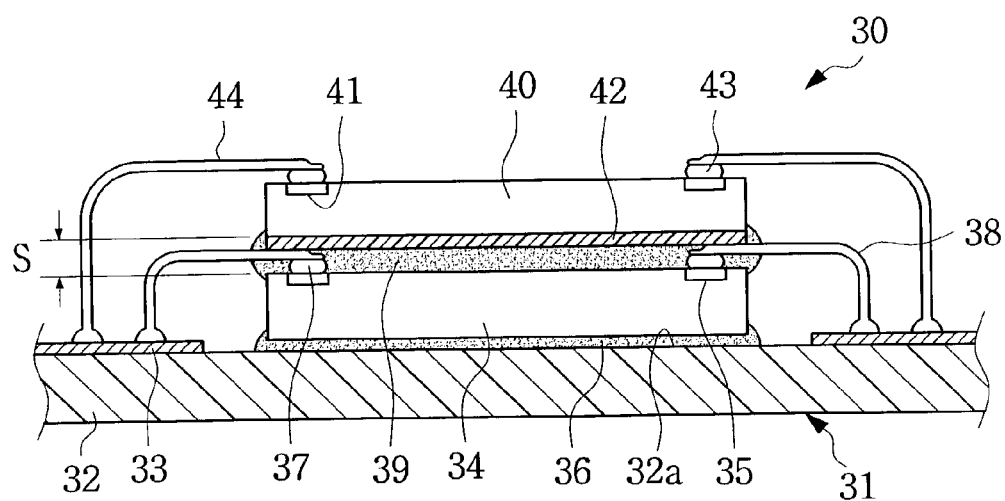
FIG. 3 is a cross-sectional view of a semiconductor chip stack structure in accordance with an embodiment of the present invention.

FIG. 3 is a cross-sectional view of a semiconductor chip stack structure in accordance with one embodiment of the present invention. Referring to FIG. 3, a first semiconductor chip 34 and a second semiconductor chip 40 are sequentially stacked on a substrate 31. To minimize a space S between both chips 34 and 40, an insulating adhesive layer 42 is formed on the bottom surface of the second chip 40 and is in contact with a first bonding wire 38 on the first chip 34.

The substrate 31 may be a conventional printed circuit board. The substrate 31 includes a substrate body 32 having a die-mounting surface 32a, and wiring patterns 33 surrounding the die-mounting surface 32a on the substrate body 32. Although the preferred embodiment of the present invention employs the printed circuit board as the substrate 31, other suitable substrates, such as a lead frame, a tape wiring substrate and a ceramic substrate, which are conventionally used for a semiconductor device, may be used. Further, the wiring pattern 33 may be additionally formed in and/or under the substrate body 32.

The first chip 34 is attached to the die-mounting surface 32a of the substrate 31 using an adhesive 36. The first chip 34 has first electrode pads 35 formed on the top surface thereof. The first chip 34 is a so-called edge-pad-type or peripheral-pad type chip because the first electrode pads 35 are arranged along the periphery of the top surface. Each first electrode pad 35 has a first conductive bump 37 formed thereon.

The first chip 34 is electrically interconnected to the wiring pattern 33 of the substrate 31 through the first bonding wire 38. The electrical interconnection between the first chip 34 and the wiring pattern 33 uses a bump reverse bonding method, which minimizes the height of the first bonding wire 38 and allows stable stacking of the second chip 40 on the first bonding wire 38. Unlike a normal wire bonding, the bump reverse bonding is made such that the first bonding wire 38 is ball-bonded to the wiring pattern 33 corresponding to the first electrode pad 35 of the first chip 34 at one end and then stitch-bonded to the first metal bump 37 at the other end.

In this embodiment, the second chip 40 has substantially the same size as the first chip 34 and is stacked on the first chip 34. The second chip 40 has the insulating adhesive layer 42 formed on the bottom surface thereof to prevent the electrical interference between the second chip 40 and the first bonding wire 38 of the first chip 34. An insulating adhesive 39 is interposed between the first chip 34 and the second chip 40. The insulating adhesive 39 provides strong adhesion between the first chip 34 and the second chip 40 while protecting the portion of the first bonding wire 38 coupled to the first metal bump 37 and the top (active) surface of the first chip 34.

The first bonding wire 38 preferably starts from the wiring pattern 33 of the substrate 31 and ends on the first metal bump 37 of the first chip 34 and has a substantially 90° bend as shown in FIG. 3. Accordingly, the first bonding wire 38 preferably has an expanse substantially parallel with the top surface of the first chip 34. The second chip 40 having the insulating adhesive layer 42 is preferably placed on the expanse of the first bonding wire 38 such that the expanse can support the second chip 40. Thus, the first bonding wire 38 of the first chip 34 can support the second chip 40 stacked thereon in a highly stable manner.

The second chip 40 has a second metal bump 43 formed on a second electrode pad 41 similar to the first chip 34. The second metal bump 43 on the second chip 40 is electrically connected to the wiring pattern 33 by a second bonding wire 44 using the bump reverse bonding method.

Accordingly, the semiconductor chip stack structure 30 minimizes the space S between the first chip 34 and the second chip 40, thereby reducing the total height of semiconductor chip stack.

Although the embodiment described above uses two semiconductor chips vertically stacked on the substrate 31, it will be appreciated to an ordinary skilled person in the art that more chips can be additionally stacked on the substrate 31 in a manner similar to the above-described embodiment.

Figure 10:
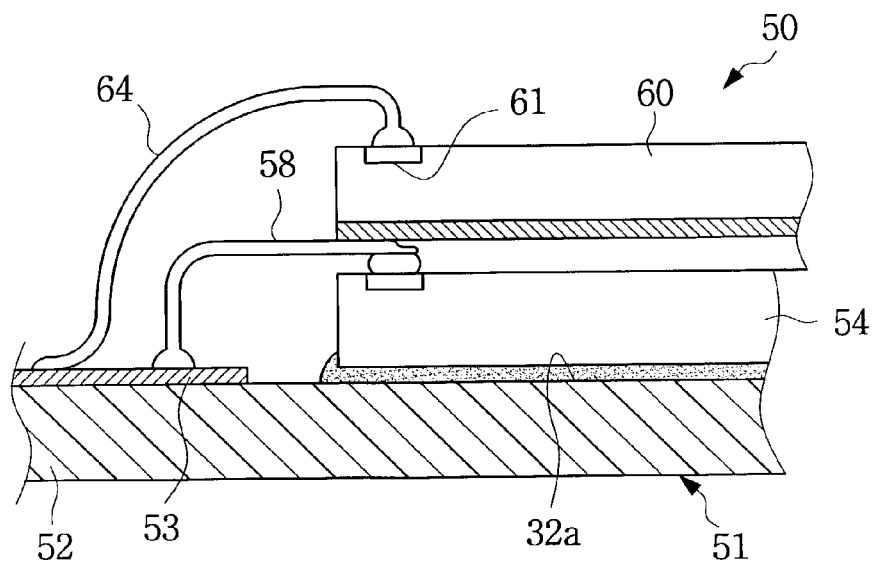
FIG. 10 is a cross-sectional view of a semiconductor chip stack structure using a normal wire bonding between the second chip and the substrate in accordance with another embodiment of the present invention.

Furthermore, although the above-described embodiment uses the bump reverse bonding method to electrically interconnect the second chip 40 and the substrate 31, a conventional wire bonding method may be used for connecting the second chip to the substrate 31 as shown in FIG. 10. Referring to FIG. 10, the second bonding wire 64 is ball-bonded at one end to the second electrode pad 61 of the second chip 60 and then stitch-bonded to the wiring pattern 53 of the substrate 31 at the other end. For the uppermost semiconductor chip such as the second chip 60 in this embodiment, it is preferred that the normal wire bonding method be performed to interconnect the uppermost chip and the substrate 51.

A method for stacking two semiconductor chips in accordance with an embodiment of the present invention is described below with reference to FIGS. 4 through 9.

Figure 4:
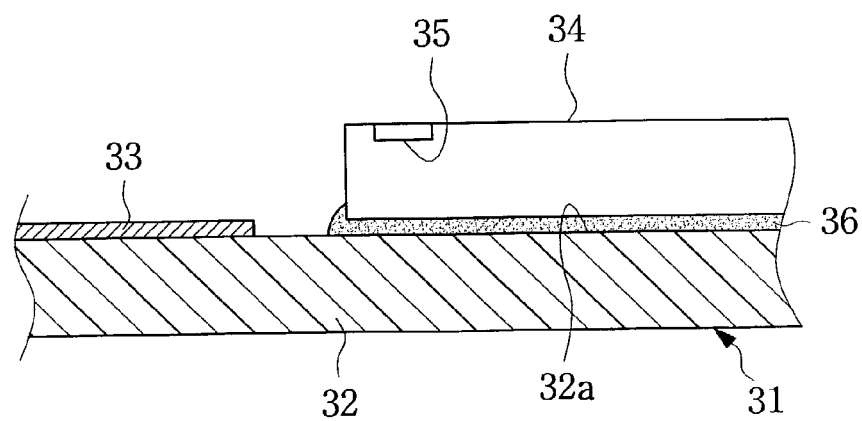
FIGS. 4 through 9 are cross-sectional views showing a semiconductor chip stack method in accordance with another embodiment of the present invention.

The semiconductor chip stack method begins with providing a substrate 31 as shown in FIG. 4. The substrate 31 includes a substrate body 32 and wiring patterns 33 which are formed on the substrate body 32 and disposed adjacent to, e.g., surrounding the die-mounting surface 32a of the substrate 31.

Then, the first chip 34 is attached to the die-mounting surface 32a of the substrate 31. The conductive adhesive or a die attach paste 36, such as Ag-epoxy adhesive, may be used in the attaching step.

Figure 5:
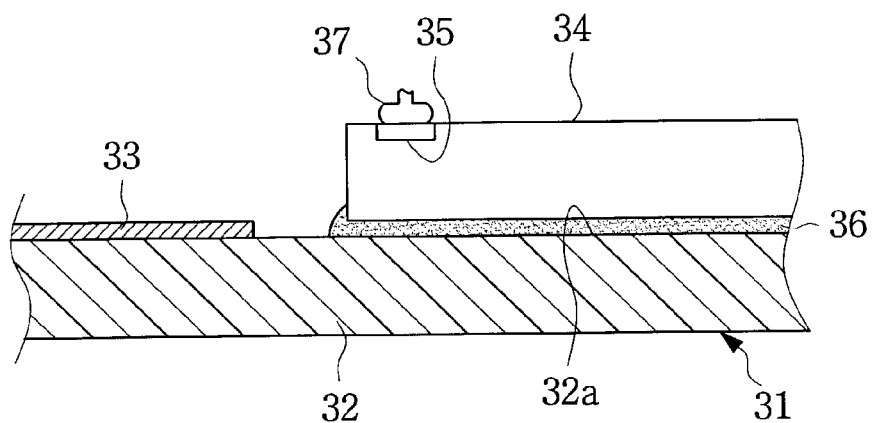

Referring to FIG. 5, a first conductive bump 37 is formed on a first electrode pad 35 of the first chip 34. The first metal bump 37 may be formed by ball bonding a bonding wire to the first electrode pad 35, thereby forming a wire ball, and then cutting the bonding wire near the top of the wire ball as illustrated in FIG. 5. Other conductive discrete elements may be used in place of the conductive bump 37.

Figure 6:
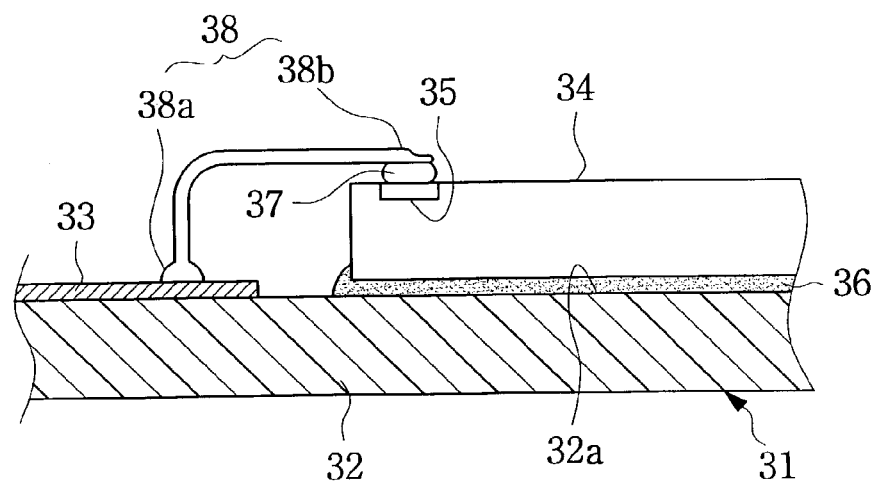

Referring to FIG. 6, the first chip 34 and the substrate 31 are preferably interconnected by the bump reverse bonding method. According to the bump reverse bonding method, a ball bonding is performed on the substrate 31 and a stitch bonding is performed on the first chip 34. That is, contrary to the normal bonding method, the first bonding wire 38 is ball-bonded to the wiring pattern 33 of the substrate 31 and then stitch-bonded to the first metal bump 37 of the first chip 34. Reference numeral 38a refers to a ball-bonded end of the first bonding wire 38 and reference numeral 38b refers to a stitch-bonded end of the first bonding wire 38. The first bonding wire 38 above the first chip 34 is substantially parallel with the top surface of the first chip 34 because the stitch-bonded end is connected to the first metal bump 37 instead of the ball-bonded end, which is formed by a wire bonding process that requires a certain rising curve. Thus, other bonding methods that do not require a certain rising curve can be used in the present invention.

Figure 7:
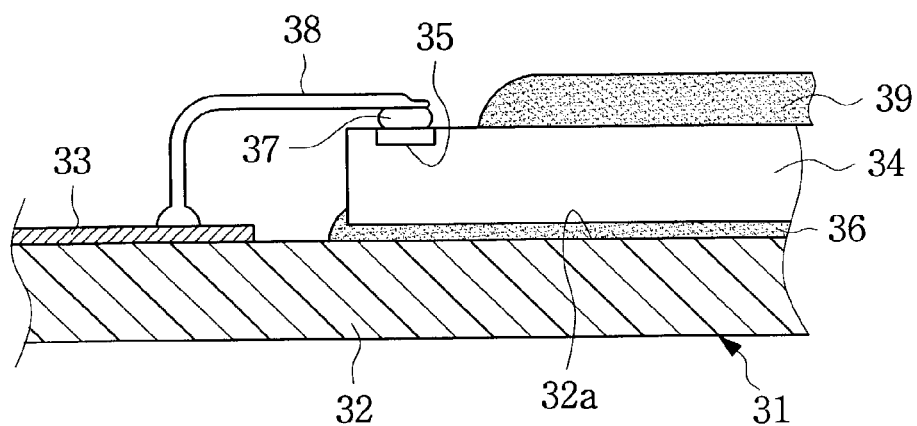

Referring to FIG. 7, an insulating adhesive 39 is applied on the first chip 34, specifically, within a portion surrounded by the first electrode pads 35 of the first chip 34. The thickness of the insulating adhesive 39 should be greater than the highest point of the first bonding wire 38. The insulating adhesive 39 may be epoxy or silicone insulating adhesive having a predetermined viscosity.

Figure 8:
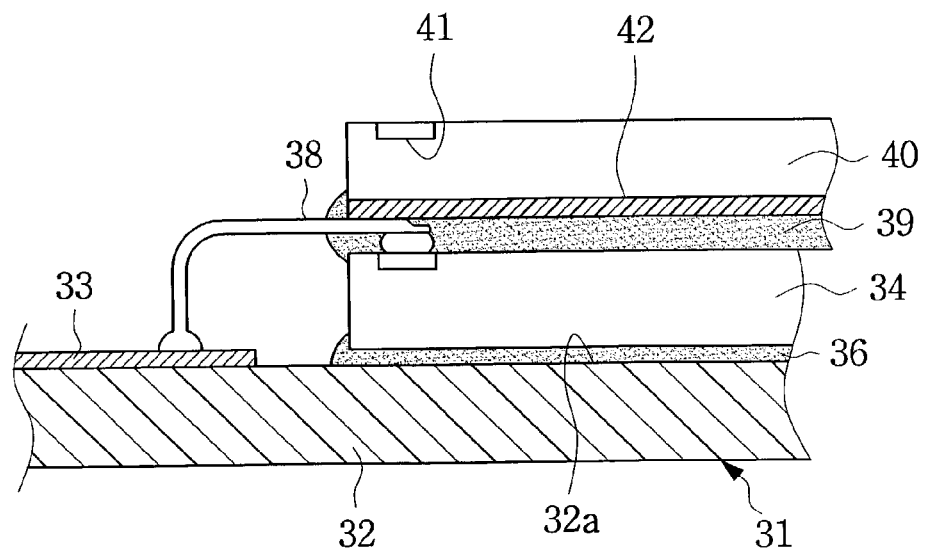

Referring to FIG. 8, the second chip 40 is stacked over the first chip 34 with the insulating adhesive 39. The second chip 40 is placed on and presses the insulating adhesive 39 with the weight thereof. The insulating adhesive 39 having a predetermined viscosity spreads and consequently seals the space between the first chip 34 and the second chip 40 hermetically. If the second chip 40 is stacked on the first chip 34 without any interposer, the bottom surface of the second chip 40 may mechanically contact the first bonding wire 38 of the first chip 34. The insulating adhesive layer 42 is therefore formed on the bottom surface of the second chip 40 to prevent the mechanical contact. The insulating adhesive layer 42 of the second chip 40 is therefore in contact with the first bonding wire 38.

The second chip 40 having the insulating adhesive layer 42 may be formed using conventional techniques. For example, such a chip 40 may be obtained from an ultraviolet (UV) tape used as a dicing tape during a wafer sawing process. The UV tape adheres to the bottom surface of the wafer and secures individual chips in the wafer after sawing. By applying UV rays to the UV tape, an insulating adhesive layer 42 in the UV tape is detached from the UV tape. Therefore, the insulating adhesive layer 42 remains adhering to the bottom surface of the chip 20 while the chip 20 is separated from the wafer.

Figure 9:
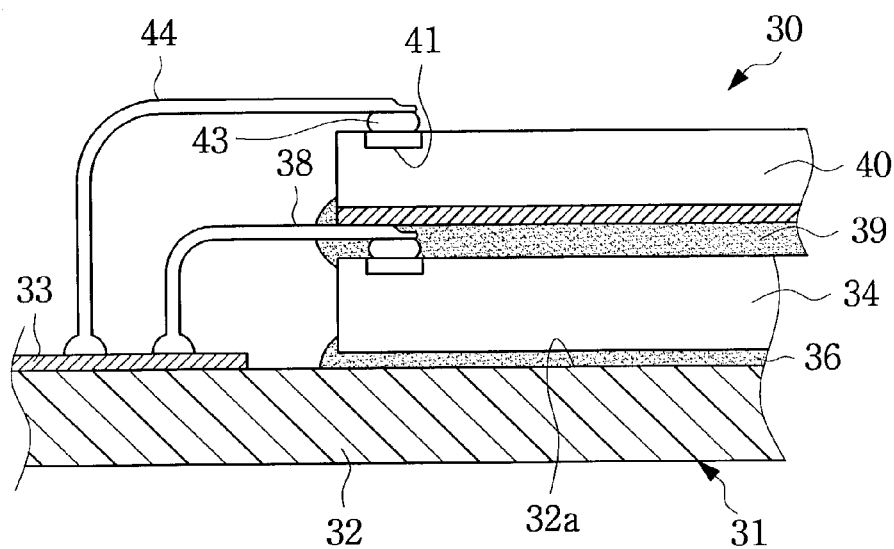

Referring to FIG. 9, the second chip 40 and the substrate 31 are electrically interconnected through the second bonding wire 44, or other suitable interconnection means. Like the first bonding wire 38, the interconnection by the second bonding wire 44 preferably uses the bump reverse bonding method. Before the interconnection, the second metal bump 43 is formed on the second electrode pad 41 of the second chip 40.

According to another embodiment of the present invention, more chips may be additionally stacked on the second chip 40 using the techniques described above.

A package assembly process following the semiconductor chip stack process may be identical to a conventional package assembly process.

Although the preferred embodiments of the present invention have been described in detail hereinabove, it should be understood that many variations and/or modifications of the basic inventive concepts herein taught, which may appear to those skilled in the art, will still fall within the spirit and scope of the present invention as defined in the appended claims.

What is claimed is:

1. A semiconductor chip stack structure comprising:
   a substrate including a die-mounting surface and wiring patterns adjacent the die-mounting surface;
   a first semiconductor chip attached to the die-mounting surface and including first electrode pads on a top surface thereof;
   first conductive bumps formed on the first electrode pads;
   first bonding wires electrically interconnecting the substrate and the first conductive bumps, the first bonding wires having an expanse substantially parallel with the top surface of the first chip; and
   a second semiconductor chip stacked over the first chip using the expanse of the first bonding wires, the second semiconductor chip including second electrode pads on a top surface thereof and being electrically connected to the wiring patterns, the second chip including an insulating adhesive layer on a bottom surface thereof, wherein the second chip including the insulating adhesive layer is in direct contact with the expanse,
   wherein at least one of the first bonding wires contacts a portion of the insulating adhesive layer, the portion directly overlying a corresponding one of the first conductive bumps, and wherein the at least one of the first bonding wires is supported by the corresponding one of the conductive bumps.

2. The structure of claim 1, further comprising an insulating adhesive formed between the top surface of the first chip and the second semiconductor chip, and wherein the insulating adhesive extends outwardly beyond side surfaces of the first and second chips.

3. The structure of claim 2, wherein the insulating adhesive is epoxy or silicone insulating adhesive.

4. The structure of claim 3, wherein the insulating adhesive hermetically seals a space between the first chip and the second chip.

5. The structure of claim 1, wherein the insulating adhesive layer of the second chip is in contact with the first bonding wire.

6. The structure of claim 1, wherein one end of each first bonding wire is ball-bonded to the wiring pattern of the substrate and the other end of the first bonding wire is stitch-bonded to the first metal bump of the first chip.

7. The structure of claim 1, wherein the substrate is selected from the group consisting of a lead frame, a printed circuit board, a tape wiring substrate and a ceramic substrate.

8. The structure of claim 1, wherein the first electrode pads are arranged along a periphery of the top surface of the first chip.

9. The structure of claim 1, further comprising second bonding wires electrically interconnecting the second electrode pads of the second chip and the wiring patterns.

10. The structure of claim 9, further comprising second conductive bumps formed on the second electrode pads of the second chip.

11. The structure of claim 10, wherein one end of the second bonding wire is ball-bonded to the wiring pattern of the substrate and the other end is stitch-bonded to the second metal bump formed on the second chip.

12. The structure of claim 1, wherein the first bonding wire has a substantially 90° bend.

13. The structure of claim 1, wherein the adhesive layer and said expanse flushly abut one another.

14. The structure of claim 1, wherein a bottom portion of the expanse contacts an upper portion of the corresponding one of the conductive bumps.

* * * * *